(12) United States Patent
Turner

(10) Patent No.: US 12,081,198 B2
(45) Date of Patent: Sep. 3, 2024

(54) TRANSVERSELY-EXCITED FILM BULK ACOUSTIC RESONATOR WITH A BACK-SIDE DIELECTRIC LAYER AND AN ETCH-STOP LAYER

(71) Applicant: Murata Manufacturing Co., Ltd., Nagaokakyo (JP)

(72) Inventor: Patrick Turner, San Bruno, CA (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 776 days.

(21) Appl. No.: 17/115,767

(22) Filed: Dec. 8, 2020

(65) Prior Publication Data

US 2021/0257991 A1 Aug. 19, 2021

Related U.S. Application Data

(63) Continuation of application No. 16/933,224, filed on Jul. 20, 2020, now Pat. No. 10,911,023.
(Continued)

(51) Int. Cl.
*H03H 9/56* (2006.01)
*H03H 3/02* (2006.01)
(Continued)

(52) U.S. Cl.
CPC .............. *H03H 9/568* (2013.01); *H03H 3/02* (2013.01); *H03H 9/02015* (2013.01);
(Continued)

(58) Field of Classification Search
CPC ............... H03H 9/568; H03H 9/02015; H03H 9/02031; H03H 9/02062; H03H 9/02228;
(Continued)

(56) References Cited

U.S. PATENT DOCUMENTS 5,853,601 A 12/1998 Krishaswamy et al.
6,540,827 B1 4/2003 Evy et al.
(Continued)

FOREIGN PATENT DOCUMENTS

CN 106788318 A 5/2017
CN 110417373 A 11/2019
(Continued)

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.
(Continued)

*Primary Examiner* — Samuel S Outten
(74) *Attorney, Agent, or Firm* — ARENTFOX SCHIFF LLP

(57) ABSTRACT

Acoustic resonator devices and methods are disclosed. An acoustic resonator device includes a substrate having a surface and a single-crystal piezoelectric plate having front and back surfaces. A back-side dielectric layer is formed on the back surface. An etch-stop layer is sandwiched between the surface of the substrate and the back-side dielectric layer. A portion of the piezoelectric plate, the back-side dielectric layer, and the etch-stop layer forms a diaphragm spanning a cavity in the substrate. An interdigital transducer (IDT) is formed on the front surface of the single-crystal piezoelectric plate with interleaved fingers of the IDT disposed on the diaphragm. The etch-stop layer is impervious to an etch process used to form the cavity.

13 Claims, 7 Drawing Sheets

Related U.S. Application Data

(60) Provisional application No. 62/993,586, filed on Mar. 23, 2020, provisional application No. 62/978,133, filed on Feb. 18, 2020.

(51) Int. Cl.
- H03H 9/02 (2006.01)
- H03H 9/13 (2006.01)
- H03H 9/17 (2006.01)
- H10N 30/072 (2023.01)
- H10N 30/87 (2023.01)

(52) U.S. Cl.
CPC .... *H03H 9/02031* (2013.01); *H03H 9/02062* (2013.01); *H03H 9/02228* (2013.01); *H03H 9/132* (2013.01); *H03H 9/174* (2013.01); *H03H 9/176* (2013.01); *H03H 9/562* (2013.01); *H03H 9/564* (2013.01); *H10N 30/072* (2023.02); *H03H 2003/023* (2013.01); *H03H 9/02039* (2013.01); *H10N 30/877* (2023.02)

(58) Field of Classification Search
CPC ........ H03H 9/132; H03H 9/174; H03H 9/176; H03H 9/562; H03H 9/564
See application file for complete search history.

(56) References Cited

U.S. PATENT DOCUMENTS

| | | |
|---|---|---|
| 6,707,229 B1 | 3/2004 | Martin |
| 6,833,774 B2 | 12/2004 | Abbott et al. |
| 7,042,132 B2 | 5/2006 | Bauer et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,868,519 B2 | 1/2011 | Umeda |
| 7,939,987 B1 | 5/2011 | Solal et al. |
| 8,278,802 B1 | 10/2012 | Lee et al. |
| 8,344,815 B2 | 1/2013 | Yamanaka |
| 8,829,766 B2 | 9/2014 | Milyutin et al. |
| 8,932,686 B2 | 1/2015 | Hayakawa et al. |
| 9,112,134 B2 | 8/2015 | Takahashi |
| 9,130,145 B2 | 9/2015 | Martin et al. |
| 9,219,466 B2 | 12/2015 | Meltaus et al. |
| 9,240,768 B2 | 1/2016 | Nishihara et al. |
| 9,276,557 B1 | 3/2016 | Nordquist et al. |
| 9,369,105 B1 | 6/2016 | Li |
| 9,425,765 B2 | 8/2016 | Rinaldi |
| 9,525,398 B1 | 12/2016 | Olsson |
| 9,564,873 B2 | 2/2017 | Kadota |
| 9,748,923 B2 | 8/2017 | Kando et al. |
| 9,780,759 B2 | 10/2017 | Kimura et al. |
| 10,200,013 B2 | 2/2019 | Bower et al. |
| 10,389,391 B2 | 8/2019 | Ito et al. |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,756,697 B2 | 8/2020 | Plesski et al. |
| 10,790,802 B2 | 9/2020 | Yantchev et al. |
| 10,797,675 B2 | 10/2020 | Plesski |
| 10,819,309 B1 | 10/2020 | Turner et al. |
| 10,826,462 B2 | 11/2020 | Plesski et al. |
| 10,868,510 B2 | 12/2020 | Yantchev |
| 10,868,512 B2 | 12/2020 | Garcia et al. |
| 10,985,728 B2 | 4/2021 | Plesski et al. |
| 10,998,882 B2 | 5/2021 | Yantchev et al. |
| 11,146,232 B2 | 10/2021 | Yandrapalli et al. |
| 11,201,601 B2 | 12/2021 | Yantchev et al. |
| 11,323,089 B2 | 5/2022 | Turner |
| 11,418,167 B2 | 8/2022 | Garcia |
| 2002/0079986 A1 | 6/2002 | Ruby et al. |
| 2002/0158714 A1 | 10/2002 | Kaitila et al. |
| 2003/0128081 A1 | 7/2003 | Ella et al. |
| 2003/0199105 A1 | 10/2003 | Kub et al. |
| 2004/0041496 A1 | 3/2004 | Imai et al. |
| 2004/0207033 A1 | 10/2004 | Koshido |
| 2004/0207485 A1 | 10/2004 | Kawachi et al. |
| 2004/0261250 A1 | 12/2004 | Kadota et al. |
| 2005/0099091 A1 | 5/2005 | Mishima et al. |
| 2006/0131731 A1 | 6/2006 | Sato |
| 2007/0090898 A1 | 4/2007 | Kando |
| 2007/0115079 A1 | 5/2007 | Kubo et al. |
| 2007/0188047 A1 | 8/2007 | Tanaka |
| 2007/0194863 A1 | 8/2007 | Shibata et al. |
| 2007/0296304 A1 | 12/2007 | Fujii et al. |
| 2008/0169884 A1 | 7/2008 | Matsumoto et al. |
| 2008/0297280 A1 | 12/2008 | Thalhammer et al. |
| 2009/0315640 A1 | 12/2009 | Umeda et al. |
| 2010/0064492 A1 | 3/2010 | Tanaka |
| 2010/0123367 A1 | 5/2010 | Tai et al. |
| 2010/0212127 A1 | 8/2010 | Heinze et al. |
| 2010/0223999 A1 | 9/2010 | Onoe |
| 2010/0301703 A1 | 12/2010 | Chen et al. |
| 2011/0102107 A1 | 5/2011 | Onzuka |
| 2011/0109196 A1 | 5/2011 | Goto |
| 2013/0057360 A1 | 3/2013 | Meltaus et al. |
| 2013/0207747 A1 | 8/2013 | Nishii et al. |
| 2013/0234805 A1 | 9/2013 | Takahashi |
| 2013/0271238 A1 | 10/2013 | Onda et al. |
| 2013/0321100 A1 | 12/2013 | Wang |
| 2014/0009032 A1 | 1/2014 | Takahashi et al. |
| 2014/0009247 A1 | 1/2014 | Moriya |
| 2014/0113571 A1 | 4/2014 | Fujiwara et al. |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2014/0312994 A1 | 10/2014 | Meltaus et al. |
| 2015/0014795 A1 | 1/2015 | Franosch et al. |
| 2015/0244149 A1 | 8/2015 | Van Someren |
| 2015/0319537 A1 | 11/2015 | Perois et al. |
| 2015/0333730 A1 | 11/2015 | Meltaus |
| 2016/0028367 A1 | 1/2016 | Shealy |
| 2016/0036415 A1 | 2/2016 | Ikeuchi |
| 2016/0049920 A1 | 2/2016 | Kishino |
| 2016/0079958 A1 | 3/2016 | Burak |
| 2016/0149554 A1 | 5/2016 | Nakagawa |
| 2016/0182009 A1 | 6/2016 | Bhattacharjee |
| 2016/0294361 A1* | 10/2016 | Yamane ............ H03H 9/14594 |
| 2017/0063332 A1 | 3/2017 | Gilbert et al. |
| 2017/0179928 A1 | 6/2017 | Raihn et al. |
| 2017/0187352 A1 | 6/2017 | Omura |
| 2017/0201232 A1 | 7/2017 | Nakamura et al. |
| 2017/0214385 A1 | 7/2017 | Bhattacharjee |
| 2017/0214387 A1 | 7/2017 | Burak et al. |
| 2017/0214389 A1 | 7/2017 | Tsutsumi |
| 2017/0222622 A1 | 8/2017 | Solal et al. |
| 2017/0264266 A1 | 9/2017 | Kishimoto |
| 2017/0290160 A1 | 10/2017 | Takano et al. |
| 2017/0359050 A1 | 12/2017 | Irieda et al. |
| 2017/0370791 A1 | 12/2017 | Nakamura et al. |
| 2018/0013400 A1 | 1/2018 | Ito et al. |
| 2018/0013405 A1 | 1/2018 | Takata |
| 2018/0123016 A1 | 5/2018 | Gong et al. |
| 2018/0152169 A1 | 5/2018 | Goto et al. |
| 2018/0191322 A1 | 7/2018 | Chang et al. |
| 2018/0212589 A1 | 7/2018 | Meltaus et al. |
| 2018/0309426 A1 | 10/2018 | Guenard et al. |
| 2018/0316333 A1 | 11/2018 | Nakamura et al. |
| 2018/0358948 A1 | 12/2018 | Gong et al. |
| 2019/0007022 A1 | 1/2019 | Goto et al. |
| 2019/0068155 A1 | 2/2019 | Kimura et al. |
| 2019/0068164 A1 | 2/2019 | Houlden et al. |
| 2019/0123721 A1 | 4/2019 | Takamine |
| 2019/0131953 A1 | 5/2019 | Gong |
| 2019/0181825 A1 | 6/2019 | Schmalzl et al. |
| 2019/0181833 A1 | 6/2019 | Nosaka |
| 2019/0207583 A1 | 7/2019 | Miura et al. |
| 2019/0245515 A1* | 8/2019 | Hurwitz ............ H03H 3/02 |
| 2019/0245518 A1 | 8/2019 | Ito |
| 2019/0273480 A1 | 9/2019 | Lin |

(56) References Cited

U.S. PATENT DOCUMENTS

| | | |
|---|---|---|
| 2019/0348966 A1 | 11/2019 | Campanella-Pineda et al. |
| 2020/0021272 A1 | 1/2020 | Segovia Fernandez et al. |
| 2020/0244247 A1 | 7/2020 | Maeda |
| 2020/0274520 A1 | 8/2020 | Shin et al. |
| 2020/0295729 A1 | 9/2020 | Yantchev |
| 2020/0304091 A1 | 9/2020 | Yantchev |
| 2020/0321939 A1 | 10/2020 | Turner et al. |
| 2020/0328728 A1 | 10/2020 | Nakagawa et al. |
| 2020/0373907 A1 | 11/2020 | Garcia |
| 2021/0273631 A1 | 9/2021 | Jachowski et al. |
| 2021/0313951 A1 | 10/2021 | Yandrapalli et al. |
| 2021/0328575 A1 | 10/2021 | Hammond et al. |
| 2022/0103160 A1 | 3/2022 | Jachowski et al. |
| 2022/0116015 A1 | 4/2022 | Garcia et al. |
| 2022/0123720 A1 | 4/2022 | Garcia et al. |
| 2022/0123723 A1 | 4/2022 | Garcia et al. |
| 2022/0149808 A1 | 5/2022 | Dyer et al. |
| 2022/0149814 A1 | 5/2022 | Garcia et al. |

FOREIGN PATENT DOCUMENTS

| | | |
|---|---|---|
| CN | 210431367 U | 4/2020 |
| CN | 113765495 A | 12/2021 |
| JP | H10209804 A | 8/1998 |
| JP | 2001244785 A | 9/2001 |
| JP | 2002300003 A | 10/2002 |
| JP | 2003078389 A | 3/2003 |
| JP | 2004096677 A | 3/2004 |
| JP | 2004129222 A | 4/2004 |
| JP | 2004523179 A | 7/2004 |
| JP | 2004304622 A | 10/2004 |
| JP | 2006173557 A | 6/2006 |
| JP | 2007251910 A | 9/2007 |
| JP | 2007329584 A | 12/2007 |
| JP | 2010062816 A | 3/2010 |
| JP | 2010103803 A | 5/2010 |
| JP | 2010154505 A | 7/2010 |
| JP | 2010233210 A | 10/2010 |
| JP | 2013528996 A | 7/2013 |
| JP | 2013214954 A | 10/2013 |
| JP | 2015054986 A | 3/2015 |
| JP | 2016001923 A | 1/2016 |
| JP | 2017526254 A | 9/2017 |
| JP | 2017220910 A | 12/2017 |
| JP | 2018093487 A | 6/2018 |
| JP | 2018166259 A | 10/2018 |
| JP | 2018207144 A | 12/2018 |
| JP | 2019186655 A | 10/2019 |
| JP | 2020113939 A | 7/2020 |
| WO | 2010047114 A1 | 4/2010 |
| WO | 2013021948 A1 | 2/2013 |
| WO | 2015098694 A1 | 7/2015 |
| WO | 2016017104 | 2/2016 |
| WO | 2016052129 A1 | 4/2016 |
| WO | 2016147687 A1 | 9/2016 |
| WO | 2017188342 A1 | 11/2017 |
| WO | 2018003268 A1 | 1/2018 |
| WO | 2018003273 A1 | 1/2018 |
| WO | 2018163860 A1 | 9/2018 |
| WO | 2019117133 A1 | 6/2019 |
| WO | 2019138810 A1 | 7/2019 |
| WO | 2020092414 A2 | 5/2020 |
| WO | 2020100744 A1 | 5/2020 |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHZ Lithium Niobate MEMs Resonators With High Fom Of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics Symposium—pp. 2110-2113. (Year: 2003).

Webster Dictionary Meaning of "diaphragm" Merriam Webster since 1828.

Chen et al., "Development and Application of SAW Filter," Micromachines, Apr. 20, 2022, vol. 13, No. 656, pp. 1-15.

Hermann et al., "Properties of shear-horizontal surface acoustic waves in different layered quartz-SiO2 structures," Ultrasonics, 1999, vol. 37, pp. 335-341.

Lam et al., "A Review of Lame and Lamb Mode Crystal Resonators for Timing Applications and Prospects of Lame and Lamb Mode Piezo MEMS Resonators for Filtering Applications," 2018 International Symposium on Acoustic Wave Devices for Future Mobile Communication Systems, Mar. 6-7, 2018, 12 pages.

Abass et al., "Effects of inhomogeneous grain size distribution in polycrystalline silicon solar cells," Energy Procedia, 2011, vol. 10, pp. 55-60.

Gnewuch et al., "Broadband monolithic acousto-optic tunable filter," Optics Letters, Mar. 2000, vol. 25, No. 5, pp. 305-307.

Gorisse et al., "Lateral Field Excitation of membrane-based Aluminum Nitride resonators," 2011 Joint Conference of the IEEE International Frequency Control and the European Frequency and Time Forum (FCS) Proceedings, 2011, 5 pages.

Kadota et al., "Ultra Wideband Ladder Filter Using SH0 Plate Wave in Thin LiNbO3 Plate and Its Application to Tunable Filter," IEEE Transactions on Ultrasonics, Ferroelectrics, and Frequency Control, 2015, vol. 62, No. 5, pp. 939-946.

Pang et al., "Self-Aligned Lateral Field Excitation Film Acoustic Resonator with Very Large Electromechanical Coupling," 2004 IEEE International Ultrasonics, Ferroelectrics and Frequency Control Joint 50th Anniversary Conference, 2004, pp. 558-561.

Reinhardt et al., "Acoustic filters based on thin single crystal LiNbO3 films: status and prospects," IEEE International Ultrasonics Symposium, Sep. 2014, pp. 773-781.

Xue et al., "High Q Lateral-Field-Excited Bulk Resonator Based on Single-Crystal LiTaO3 for 5G Wireless Communication," Journal of Electron Devices Society, Mar. 2021, vol. 9, pp. 353-358.

Yandrapalli et al., "Toward Band n78 Shear Bulk Acccoustic Resonators Using Crystalline Y-Cut Lithium Niobate Films wit Spurious Suppression," Journal of Microelectromechanical Systems, Aug. 2023, vol. 32, No. 4, pp. 327-334.

* cited by examiner

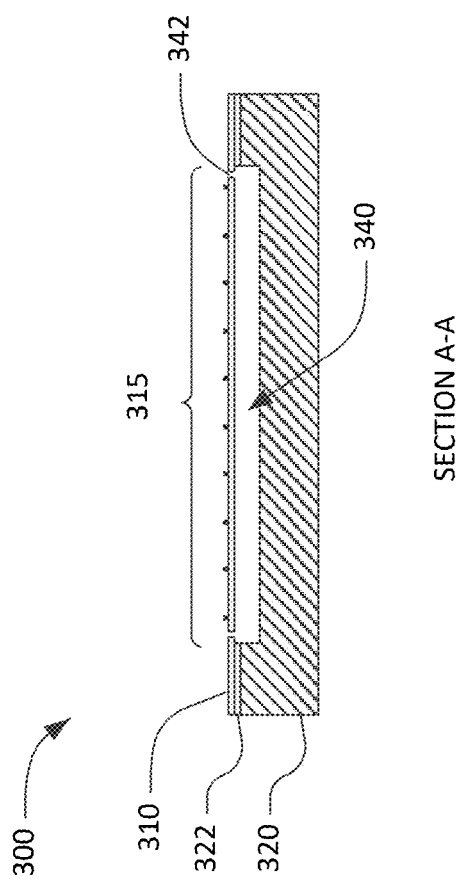

TRANSVERSELY-EXCITED FILM BULK ACOUSTIC RESONATOR WITH A BACK-SIDE DIELECTRIC LAYER AND AN ETCH-STOP LAYER

RELATED APPLICATION INFORMATION

This patent is a continuation of application Ser. No. 16/933,224, titled TRANSVERSELY-EXCITED FILM BULK ACOUSTIC RESONATOR WITH ETCH-STOP LAYER, filed Jul. 20, 2020, which claims priority to provisional patent application 62/978,133, titled XBAR WITH AL2O3 ETCH-STOP AND BONDING LAYER, filed Feb. 18, 2020, and provisional patent application 62/993,586, titled THIN FILM LAYER TO IMPROVE POWER OF XBAR RESONATORS, filed Mar. 23, 2020.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

The desire for wider communication channel bandwidths will inevitably lead to the use of higher frequency communications bands. The current LTE™ (Long Term Evolution) specification defines frequency bands from 3.3 GHz to 5.9 GHZ. These bands are not presently used. Future proposals for wireless communications include millimeter wave communication bands with frequencies up to 28 GHz.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies proposed for future communications networks.

DESCRIPTION OF THE DRAWINGS

FIG. 3 is an alternative schematic cross-sectional view of the XBAR of FIG. 1.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
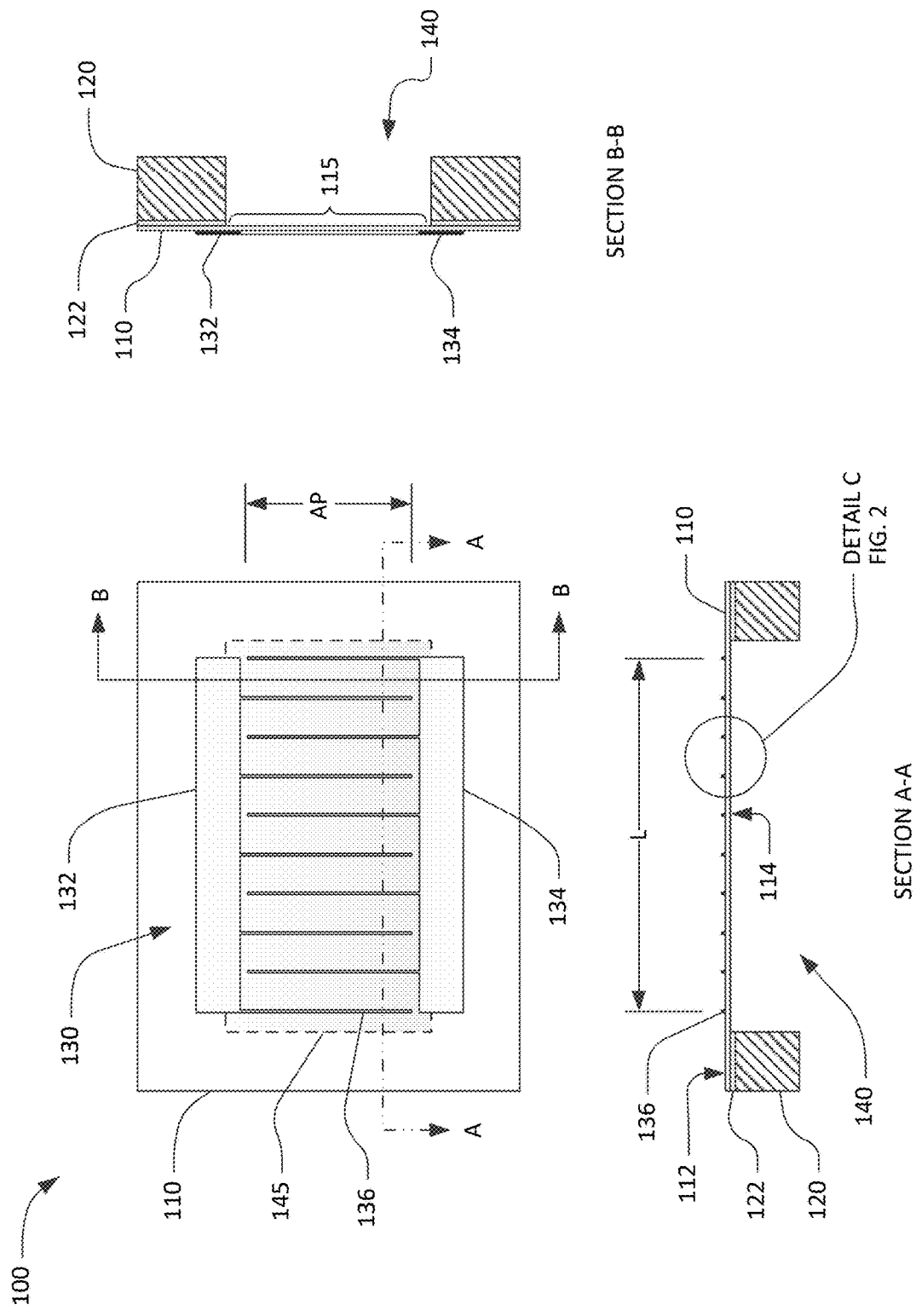
FIG. 1 includes a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the surfaces. However, XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, sapphire, quartz, or some other material. The substrate 120 may be a composite of two or more materials. For example, the substrate 120 may be a first material, such as silicon, with an inset island of a second material, such as silicon dioxide or phosphosilicate glass (PSG). The inset island may be subsequently removed to form a cavity, which will be described subsequently. The piezoelectric plate 110 may be bonded to a surface of the substrate 120 using a wafer bonding process, or grown on the substrate 120, or attached to the substrate in some other manner. The piezoelectric plate may be attached directly to the substrate or may be attached to the substrate via an intermediate bonding layer 122. For example, when the substrate 120 is silicon, the bonding layer 122 may be silicon dioxide.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites an acoustic wave within the piezoelectric plate 110. As will be discussed in further detail, the excited acoustic wave is a bulk shear wave that propagates in the direction normal to the surface of the piezoelectric plate 110, which is also normal, or transverse, to the direction of the electric field created by the IDT fingers. Thus, the XBAR is considered a transversely-excited film bulk wave resonator.

A cavity 140 is formed in the substrate 120 such that a portion 115 of the piezoelectric plate 110 containing the IDT 130 is suspended over the cavity 140 without contacting the substrate 120. "Cavity" has its conventional meaning of "an empty space within a solid body." The cavity 140 may be a hole completely through the substrate 120 (as shown in Section A-A and Section B-B) or a recess in the substrate 120 (as shown subsequently in FIG. 3). The cavity 140 may be formed, for example, by selective etching of the substrate 120 before or after the piezoelectric plate 110 and the substrate 120 are attached. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

The portion 115 of the piezoelectric plate suspended over the cavity 140 will be referred to herein as the "diaphragm" (for lack of a better term) due to its physical resemblance to the diaphragm of a microphone. The diaphragm may be continuously and seamlessly connected to the rest of the piezoelectric plate 110 around all, or nearly all, of perimeter of the cavity 140.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
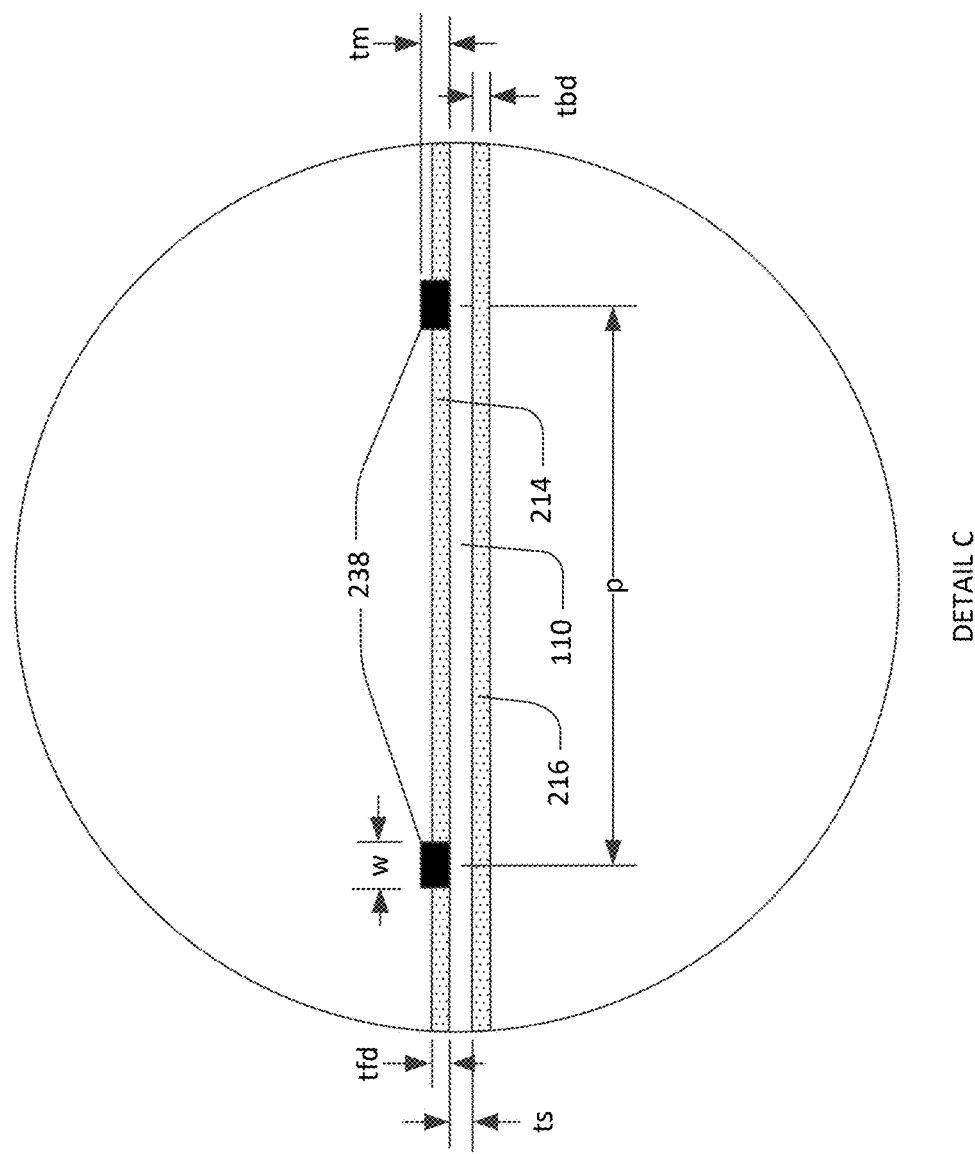
FIG. 2 is an expanded schematic cross-sectional view of a portion of the XBAR of FIG. 1.

FIG. 2 shows a detailed schematic cross-sectional view of the XBAR 100 of FIG. 1. The piezoelectric plate 110 is a single-crystal layer of piezoelectrical material having a thickness ts. ts may be, for example, 100 nm to 1500 nm. When used in filters for LTE™ bands from 3.4 GHZ to 6 GHz (e.g. bands 42, 43, 46), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 238. Although not shown in FIG. 2, the front side dielectric layer 214 may also be deposited over the IDT fingers 238. A back-side dielectric layer 216 may optionally be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. tfd and tbd may be, for example, 0 to 500 nm. tfd and tbd are typically less than the thickness ts of the piezoelectric plate. tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The IDT fingers 238 may be aluminum or a substantially aluminum alloy, copper or a substantially copper alloy, beryllium, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness ts of the piezoelectric slab 212. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

FIG. 3 is an alternative cross-sectional view along the section plane A-A defined in FIG. 1. In FIG. 3, a piezoelectric plate 310 is attached to a substrate 320. A bonding layer 322 may be present between the piezoelectric plate 310 and the substrate 320. A cavity 340, which does not fully penetrate the substrate 320, is formed in the substrate 320 (and the bonding layer 322 if present) under the portion of the piezoelectric plate 310 containing the IDT of an XBAR. The cavity 340 may be formed, for example, by etching the substrate 320 with a selective etchant that reaches the substrate through one or more openings 342 provided in the piezoelectric plate 310. When the bonding layer 322 is present, the bonding layer may also be etched with a selective etchant that reaches the bonding layer through the one or more openings 342.

The XBAR 300 shown in FIG. 3 will be referred to herein as a "front-side etch" configuration since the cavity 340 is etched from the front side of the substrate 320. The XBAR 100 of FIG. 1 will be referred to herein as a "back-side etch" configuration since the cavity 140 is etched from the back side of the substrate 120 after attaching the piezoelectric plate 110.

Figure 4A:
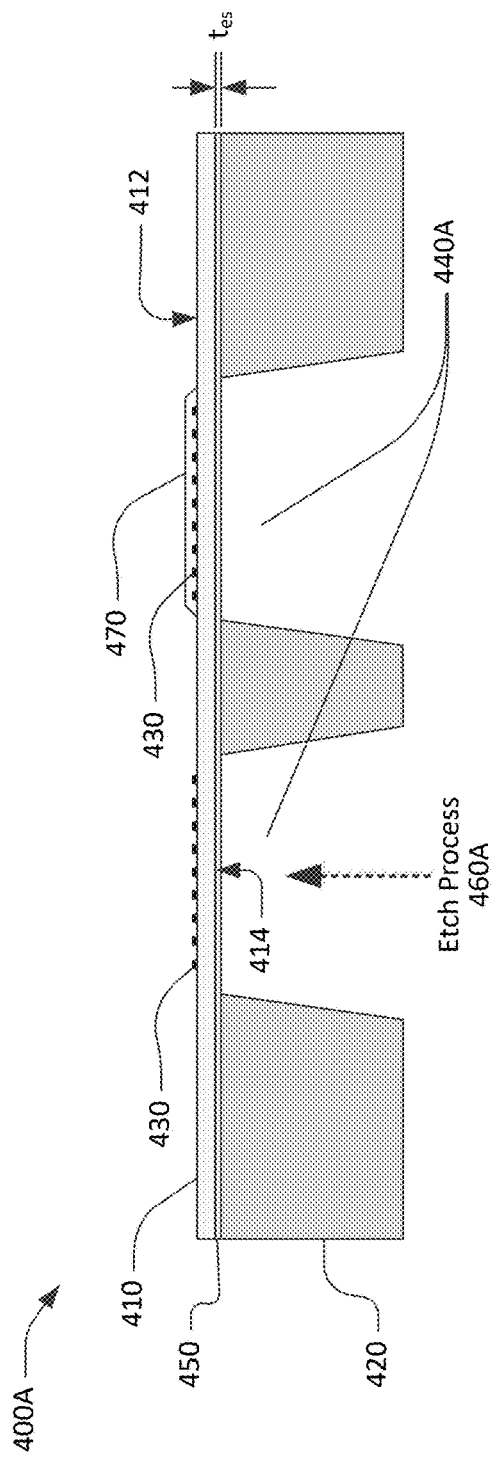
FIG. 4A is a schematic cross-sectional view of an XBAR with an etch-stop layer and back-side etched cavities.

FIG. 4A is a schematic cross-sectional view of an XBAR device 400A with an etch-stop layer and back-side etched cavities. The XBAR device 400A includes two XBARs, each of which is similar to the XBAR 100 of FIG. 1. A back surface 414 of a piezoelectric plate 410 is attached to a substrate 420. An electrode pattern is formed on a front surface 412 of the piezoelectric plate 410. The electrode pattern includes interleaved fingers 430 of respective IDTs for the two XBARs. The IDT fingers 430 are disposed over respective cavities 440A formed in the substrate 420. The materials of the piezoelectric plate, substrate, and electrode pattern are as previously described.

The primary difference between the XBAR device 400A and the XBAR 100 of FIG. 1 is the presence of an etch-stop layer 450 sandwiched between the piezoelectric plate 410 and the substrate 420. The term "sandwiched" means the etch-stop layer 450 is both disposed between and physically connected to a surface of the substrate 420 and the back surface 414 of the piezoelectric plate 410. In some embodiments, as will be described subsequently, layers of additional materials may be disposed between the etch-stop layer 450 and the surface of the substrate 420 and/or between the etch-stop layer 450 and the back surface 414 of the piezoelectric plate 410. In XBAR device 400A, the piezoelectric plate 410 is not bonded directly to the substrate 420 but is attached to the substrate 420 via the etch-stop layer 450.

The cavities 440A are formed by using an etch process to remove material from the substrate. The etch process may be a "wet" process using a liquid etchant, or a "dry" process such as reactive ion etching or sputter etching that use a gaseous etchant. As represented by the dashed arrow 460A, the etch process proceeds from the back surface of the substrate and progressively removes material from the substrate until the cavities 440A are formed. In the absence of the etch-stop layer 450, at least a portion of the back surface 414 of the piezoelectric plate 410 would be exposed to the etch process 460. The performance of the XBAR 400A is sensitive to the thickness of the piezoelectric and, to at least some extent, to the smoothness of the back surface 414. Any erosion of the back surface 414 by the etch process 460 may have a deleterious effect on the performance of the XBAR 400A.

The etch-stop layer 450 protects the back surface 414 from the etch process. To this end, the etch-stop layer 450 is impervious to the etch process represented by the dashed arrow 460A. The word "impervious" has several definitions including "not affected by" and "not allowing fluid to pass though". Both of these definitions apply to the etch-stop layer 450. The etch-stop layer is not materially affected by the etch process and does not allow the liquid or gaseous etchant used in the etch process to penetrate to the piezoelectric layer 410. The etch-stop layer need not be inert with respect to the etchant but must be highly resistant to the etchant such that a substantial portion of the etch stop layer remains after completion of the cavity etch. The remaining etch stop layer 450 is not removed after the cavities 440A are formed and becomes a portion of the diaphragms of the XBAR devices.

The etch-stop layer 450 is formed from an etch-stop material. The etch-stop material must be a dielectric with very low conductivity and low acoustic loss. The etch-stop material must have high adhesion to the surface(s) on which it is formed. Further, the etch-stop material must be compatible with attaching the piezoelectric plate to the substrate with a wafer bonding process. Most importantly, the etch-stop material must be impervious, as previously defined, to the processes and chemicals used to etch the substrate material. Suitable etch-stop materials may include oxides such as aluminum oxide and silicon dioxide, sapphire, nitrides including silicon nitride, aluminum nitride, and boron nitride, silicon carbide, and diamond.

When the etch-stop material is a high thermal conductivity dielectric, such as aluminum nitride, boron nitride, or diamond, the etch-stop layer will help conduct heat away from the diaphragm of the XBAR.

As described in U.S. Pat. No. 10,491,192, a dielectric layer 470 may be selectively formed on the front side of the piezoelectric plate 410 over the IDTs 430 of some XBARs. For example, a frequency setting dielectric layer may be formed over the IDTs of shunt resonators to lower their resonant frequencies with respect to the resonant frequencies of series resonators in a filter. The electromechanical coupling efficiency of an XBAR may be reduced and spurious modes may be enhanced if the total thickness of dielectric layers on the front and back surfaces of the piezoelectric plate exceeds about 35% of the piezoelectric plate thickness. Further, filters designed for broad communications bands such as band N77 and band N79 may require a frequency setting layer with a thickness of 20% to 30% of the piezoelectric plate thickness. To allow flexibility in selection of the frequency setting layer thickness, the thickness $t_{es}$ of the etch-stop layer 450 may be less than or equal to 10% of the piezoelectric plate thickness, and preferably about 4% to 6% of the piezoelectric plate thickness. When a frequency setting dielectric layer is not used, the thickness $t_{es}$ may be less than about 20% of the piezoelectric plate thickness.

Figure 4B:
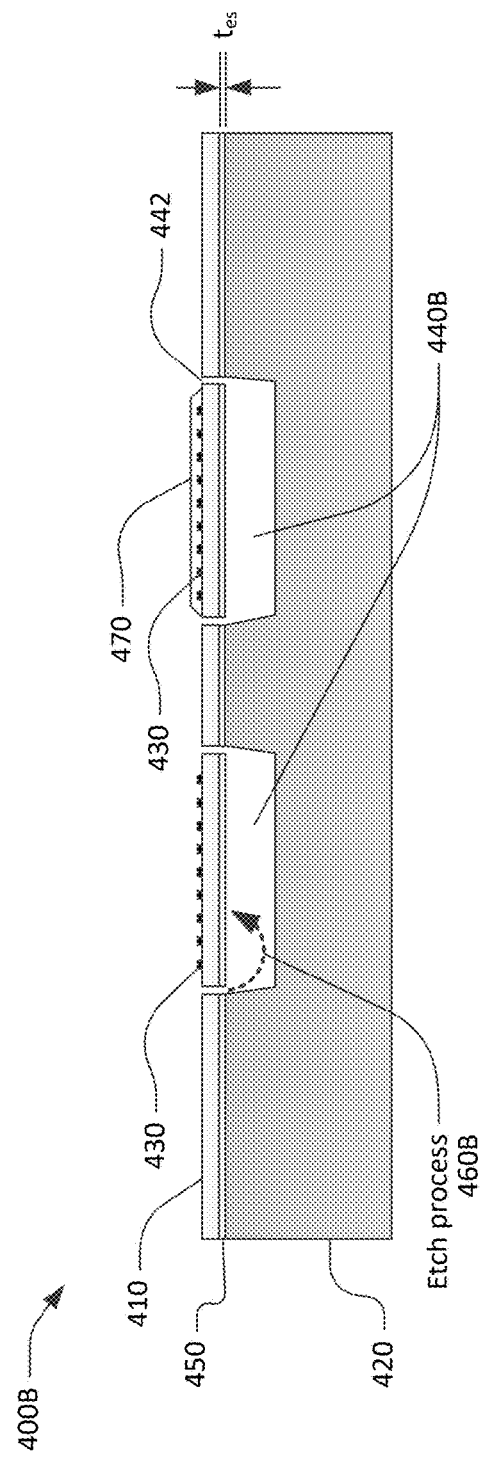
FIG. 4B is a schematic cross-sectional view of an XBAR with an etch-stop layer and front-side etched cavities.

FIG. 4B is a schematic cross-sectional view of an XBAR device 400B with an etch-stop layer and front-side etched cavities. The XBAR device 400B includes two XBARs, each of which is similar to the XBAR 100 of FIG. 1. A back surface of a piezoelectric plate 410 is attached to a substrate 420. An etch-stop layer 450 is sandwiched between the piezoelectric plate 410 and the substrate 420. An electrode pattern is formed on a front surface of the piezoelectric plate 410. The electrode pattern includes interleaved fingers 430 of respective IDTs for the two XBARs. The IDT fingers 430 are disposed over respective cavities 440B formed in the substrate 420. The materials and characteristics of the piezoelectric plate 410, substrate 420, etch-stop layer 450, and electrode pattern 430 are as previously described.

The primary difference between the XBAR device 400B and the XBAR device 400A of FIG. 4A is the etch process used to form the cavities 440B. The cavities 440B are formed with an etch process, represented by the dashed arrow 460B, using an etchant introduced though openings 442 in the piezoelectric plate 410 and the underlying etch-stop layer 450.

Figure 5A:
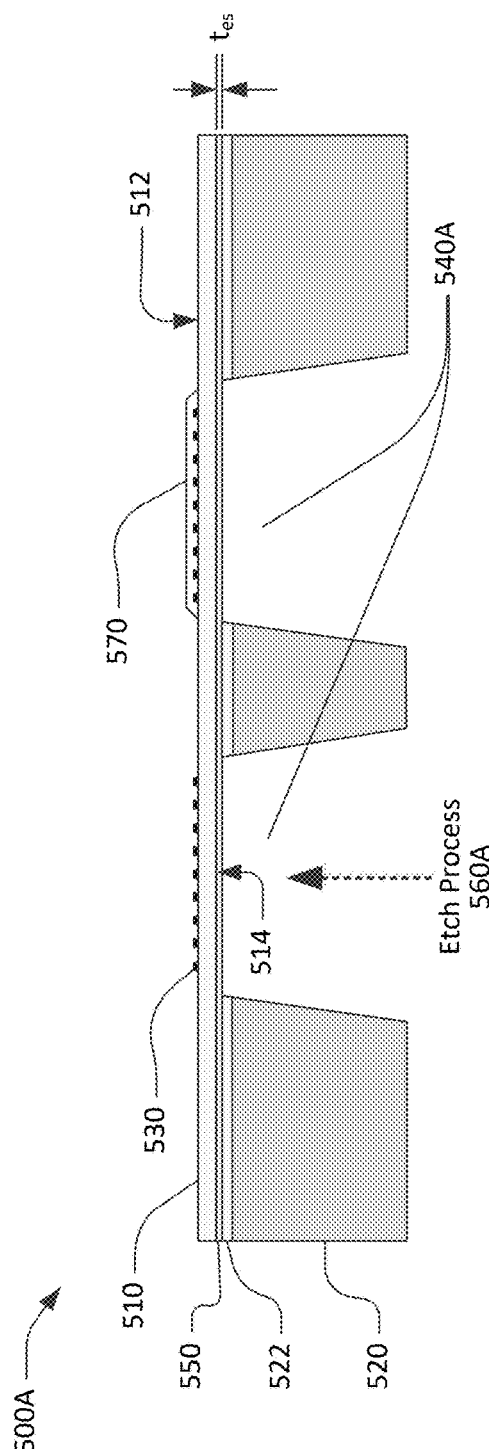
FIG. 5A is a schematic cross-sectional view of an XBAR with an etch-stop layer, a bonding layer, and back-side etched cavities.

FIG. 5A is a schematic cross-sectional view of an XBAR device 500A with an etch-stop layer and back-side etched cavities. The XBAR device 500A includes two XBARs, each of which is similar to the XBAR 100 of FIG. 1. A back surface 514 of a piezoelectric plate 510 is attached to a substrate 520 via an etch-stop layer 550. An electrode pattern is formed on a front surface 512 of the piezoelectric plate 510. The electrode pattern includes interleaved fingers 530 of respective IDTs for the two XBARs. The IDT fingers 530 are disposed over respective cavities 540A formed in the substrate 520. The materials of the piezoelectric plate 510, substrate 520, and electrode pattern 530 are as previously described.

The primary difference between the XBAR device 500A and the XBAR device 400A of FIG. 4A is the presence of a bonding layer 522 between the etch-stop layer 550 and the substrate 520. In this case, the etch-stop layer 550 is not bonded directly to the substrate 520 but is attached to the substrate 520 via the bonding layer 522. The bonding layer 522 is a material that adheres or bonds to both the substrate 520 and the etch-stop layer 550. For example, when the substrate is silicon, the bonding layer may be grown or deposited silicon dioxide.

The cavities 540A are formed by using an etch process (represented by the dashed arrow 560A) to remove material from the substrate. The etch process may be a "wet" process using a liquid etchant, or a "dry" process such as reactive ion etching or sputter etching that use a gaseous etchant. The etch process proceeds from the back surface of the substrate and progressively removes material from the substrate until the cavities 540A are opened though the substrate 520. The same or a different etch process may then be used to remove the bonding layer at the top (as shown in FIG. 5A) of the cavity. The etch-stop layer 550 is impervious to at least the process used to remove the bonding layer. The etch stop layer may be one of the etch-stop materials previously identified.

Figure 5B:
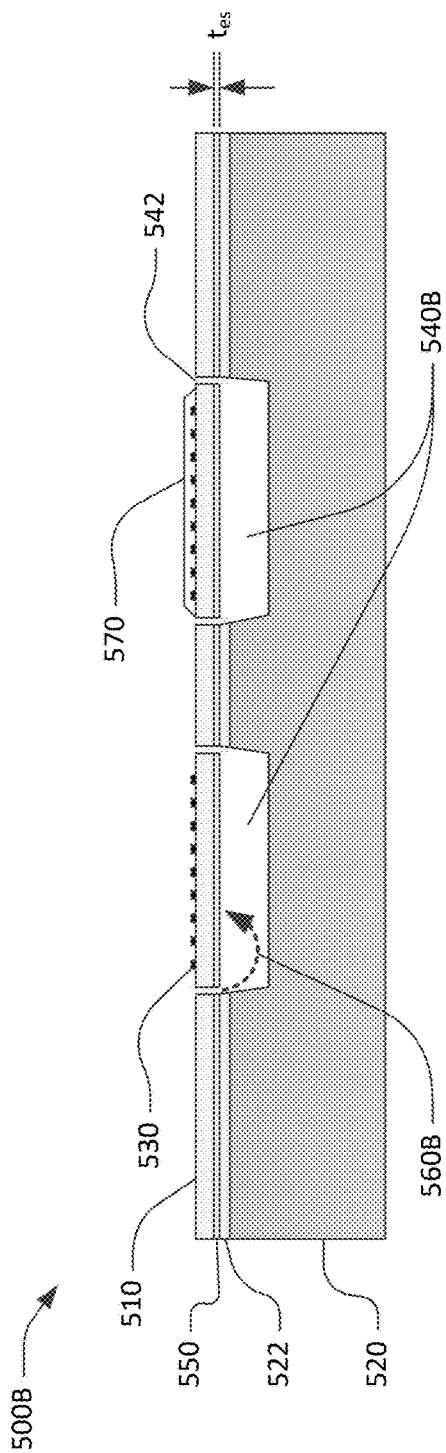
FIG. 5B is a schematic cross-sectional view of an XBAR with an etch-stop layer, a bonding layer, and front-side etched cavities.

FIG. 5B is a schematic cross-sectional view of an XBAR device 500B with an etch-stop layer and front-side etched cavities. The XBAR device 500B includes two XBARs, each of which is similar to the XBAR 100 of FIG. 1. A back surface of a piezoelectric plate 510 is attached to a substrate 520 via an etch-stop layer 550 and a bonding layer 522. The etch-stop layer 550 is sandwiched between the piezoelectric plate 510 and the bonding layer 522. The bonding layer 522 is sandwiched between the etch-stop layer 550 and the substrate 520. An electrode pattern is formed on a front surface of the piezoelectric plate 510. The electrode pattern includes interleaved fingers 530 of respective IDTs for the two XBARs. The IDT fingers 530 are disposed over respective cavities 540B formed in the substrate 520. The materials and characteristics of the piezoelectric plate 510, substrate 520, etch-stop layer 550, bonding layer 522, and electrode pattern 530 are as previously described.

The primary difference between the XBAR device 500B and the XBAR device 500A of FIG. 5A is the etch process used to form the cavities 540B. The cavities 540B are formed with an etch process, represented by the dashed arrow 560B, using an etchant introduced though openings 542 in the piezoelectric plate 510, the underlying etch-stop layer 550, and the bonding layer 522.

Figure 6A:
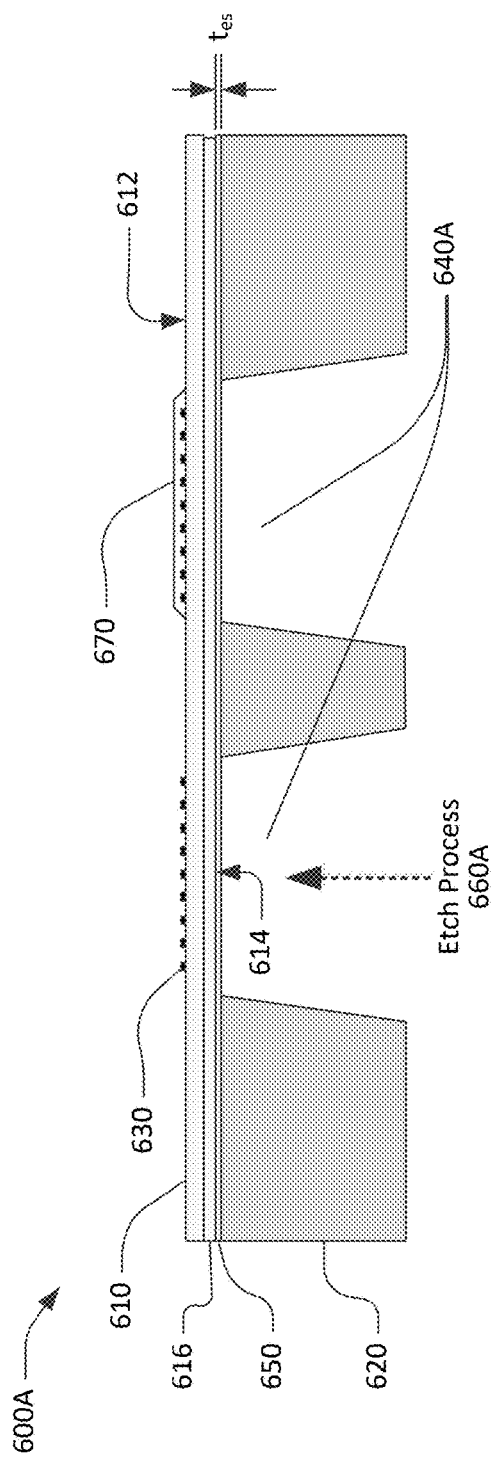
FIG. 6A is a schematic cross-sectional view of an XBAR with an etch-stop layer, a back-side dielectric layer, and back-side etched cavities.

FIG. 6A is a schematic cross-sectional view of an XBAR device 600A with an etch-stop layer and back-side etched cavities. The XBAR device 600A includes two XBARs, each of which is similar to the XBAR 100 of FIG. 1. A back surface 614 of a piezoelectric plate 610 is attached to a substrate 620 via a back-side dielectric layer 616 and an etch-stop layer 650. An electrode pattern is formed on a front surface 612 of the piezoelectric plate 610. The electrode pattern includes interleaved fingers 630 of respective IDTs for the two XBARs. The IDT fingers 630 are disposed over respective cavities 640A formed in the substrate 620. The materials of the piezoelectric plate 610, substrate 620, etch-stop layer 650, and electrode pattern 630 are as previously described.

The primary difference between the XBAR device 600A and the XBAR device 400A of FIG. 4A is the presence of the back-side dielectric layer 616 between piezoelectric plate 610 and the etch-stop layer 650. The back-side dielectric layer 616 may be, for example, a layer of silicon dioxide to provide temperature compensation, which is to say to reduce the temperature coefficient of frequency of the resonator 600A. For further example, as described in application Ser. No. 16/819,623, the back-side dielectric layer 616 may a half-wavelength layer of silicon dioxide. The back-side dielectric layer 616 may be some other dielectric material and may have a thickness other than a half-wavelength.

The cavities 640A are formed by using an etch process (represented by the dashed arrow 660A) to remove material from the substrate. The etch-stop layer 650 is impervious to the etch process used to form the cavities. The etch stop layer may be one of the etch-stop materials previously identified.

Figure 6B:
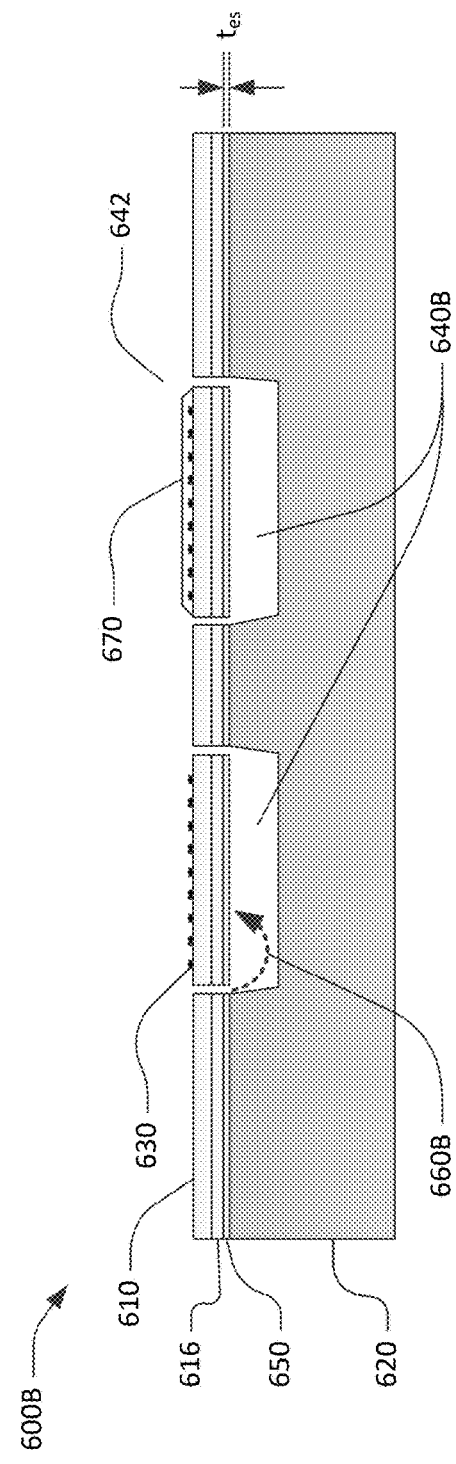
FIG. 6B is a schematic cross-sectional view of an XBAR with an etch-stop layer, a bonding layer, a back-side dielectric layer and front-side etched cavities.

FIG. 6B is a schematic cross-sectional view of an XBAR device 600B with an etch-stop layer and front-side etched cavities. The XBAR device 600B includes two XBARs, each of which is similar to the XBAR 100 of FIG. 1. A back surface of a piezoelectric plate 610 is attached to a substrate 620 via a back-side dielectric layer 616, and an etch-stop layer 650. The etch-stop layer 650 is sandwiched between the back-side dielectric layer 616 and the substrate 620. An electrode pattern is formed on a front surface of the piezoelectric plate 610. The electrode pattern includes interleaved fingers 630 of respective IDTs for the two XBARs. The IDT fingers 630 are disposed over respective cavities 640B formed in the substrate 620. The materials and characteristics of the piezoelectric plate 610, substrate 620, etch-stop layer 650, back-side dielectric layer 616, and electrode pattern 630 are as previously described.

The primary difference between the XBAR device 600B and the XBAR device 600A of FIG. 6A is the etch process used to form the cavities 640B. The cavities 640B are formed with an etch process, represented by the dashed arrow 660B, using an etchant introduced though openings 642 in the piezoelectric plate 610, the underlying back-side dielectric layer 616, and the etch-stop layer 650.

AN XBAR device may include both a bonding layer (e.g. the bonding layer 522 of FIG. 5A and FIG. 5B) and a back-side dielectric layer (e.g. the back-side dielectric layer 616 of FIG. 6A and FIG. 6B).

Description of Methods

Figure 7:
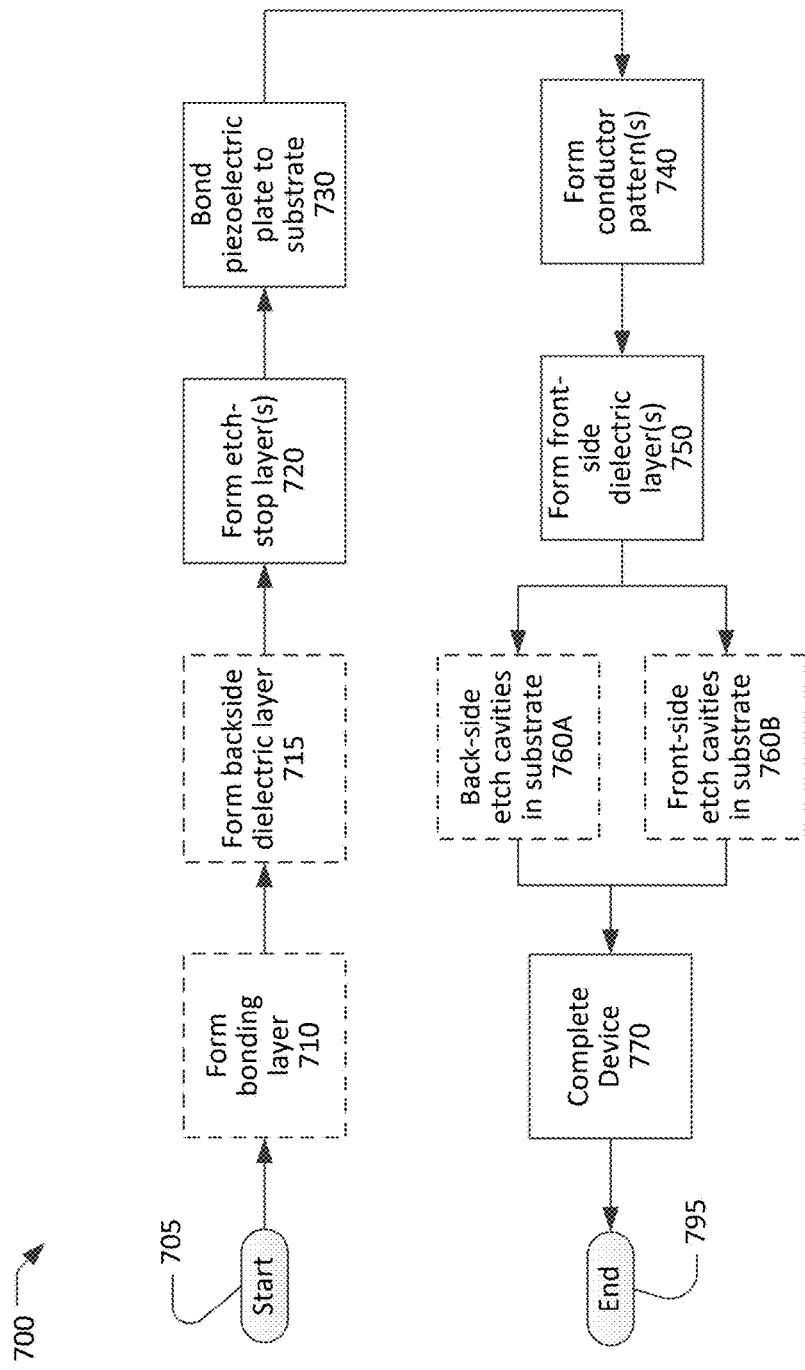
FIG. 7 is a flow chart of a process for fabricating an XBAR with an etch-stop layer.

FIG. 7 is a simplified flow chart showing a process 700 for making a device, which may be an XBAR or a filter incorporating XBARs. The process 700 starts at 705 with a substrate and a plate of piezoelectric material and ends at 795 with a completed device. The flow chart of FIG. 7 includes only major process steps. Various conventional process steps (e.g. surface preparation, cleaning, inspection, baking, annealing, monitoring, testing, etc.) may be performed before, between, after, and during the steps shown in FIG. 7.

The flow chart of FIG. 7 captures four variations of the process 700 for making devices which differ in when and how cavities are formed in the substrate, and whether or not there is a bonding layer separate from the etch-stop layer. The cavities may be formed at steps 760A or 760B. Only one of these steps is performed in each of the four variations of the process 700. The action at 710 may or may not be performed. The four variations of the process result in the six configurations of XBAR devices as shown in FIG. 4A, FIG. 4B, FIG. 5A, FIG. 5B, FIG. 6A, and FIG. 6B.

The piezoelectric plate may be, for example, lithium niobate or lithium tantalate, in which case the crystalline orientation may be Z-cut, rotated Z-cut, or rotated YX cut. The piezoelectric plate may be some other material and/or some other cut. The substrate may preferably be silicon. The substrate may be some other material that allows formation of deep cavities by etching or other processing.

At 710, a bonding layer may optionally be formed by growing or depositing a bonding material onto a surface of the substrate. The bonding material must be a dielectric with very low conductivity and have high adhesion to the substrate surface. Further, the bonding material must be compatible with attaching the piezoelectric plate to the substrate with a wafer bonding process. For example, when the substrate is silicon, the bonding material may silicon dioxide that is grown or deposited on the substrate. A bonding layer is not necessarily required on a silicon substrate. Other substrate materials, such a glass, quartz, and sapphire may not require a bonding layer.

At 715, a back-side dielectric layer may optionally be formed by depositing a dielectric material onto a back surface of the piezoelectric plate. The back-side dielectric must be a dielectric material with very low conductivity and have high adhesion to the surface of the piezoelectric plate. Further, the back-side dielectric material must have specific acoustic properties to enhance the function of the XBAR device. For example, the back-side dielectric material may be silicon dioxide which may lower the temperature coefficient of frequency of the XBAR device.

At 720, an etch stop layer is formed by depositing an etch-stop material on the back surface of the piezoelectric plate (or the back surface of the back-side dielectric layer if present), the surface of the substrate (over the bonding layer if present), or both. The etch-stop material may be deposited using atomic layer deposition (ALD), chemical vapor deposition (CVD), physical vapor deposition (PVD), or some other process. The etch-stop material must be a dielectric with very low conductivity and low acoustic loss. The etch-stop material must have high adhesion to the surface(s) on which it is deposited. Further, the etch-stop material must be compatible with attaching the piezoelectric plate to the substrate with a wafer bonding process. Importantly, the etch-stop material must be impervious to the processes and chemicals used to etch the substrate material and, if present, the bonding layer.

At 730, the piezoelectric plate is bonded to the substrate. The piezoelectric plate and the substrate may be bonded by a wafer bonding process. When the etch-stop layer is deposited on the piezoelectric plate, the wafer bond occurs between the etch-stop layer and the bonding layer, if present, or the substrate. When the etch-stop layer is deposited on the bonding layer, if present, or the substrate, the wafer bond occurs between the etch-stop layer and the piezoelectric plate. One or both mating surfaces may be activated using, for example, a plasma process. The mating surfaces may then be pressed together with considerable force to establish molecular bonds between the piezoelectric plate and the substrate or intermediate material layers.

A conductor pattern, including IDTs of each XBAR, is formed at 740 by depositing and patterning one or more conductor layers on the front side of the piezoelectric plate. The conductor layer may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs).

The conductor pattern may be formed at 740 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 740 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

At 750, one or more front-side dielectric layers may be formed by depositing one or more layers of dielectric material on the front side of the piezoelectric plate. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate.

In a first variation of the process 700, one or more cavities are formed in the back side of the substrate at 760A. A separate cavity may be formed for each resonator in a filter device. The one or more cavities may be formed using an anisotropic or orientation-dependent dry or wet etch to open holes through the back-side of the substrate to the piezoelectric plate. In this case, the resulting resonator devices will have a cross-section as shown in FIG. 1.

In a second variation of the process 700, one or more cavities in the form of recesses in the substrate may be formed at 760B by etching the substrate using an etchant introduced through openings in the piezoelectric plate and the etch-stop layer. A separate cavity may be formed for each resonator in a filter device. The one or more cavities formed at 760B will not penetrate through the substrate, and the resulting resonator devices will have a cross-section as shown in FIG. 3.

In all variations of the process 700, the filter device is completed at 770. Actions that may occur at 770 include depositing an encapsulation/passivation layer such as $SiO_2$ or $Si_3N_4$ over all or a portion of the device; forming bonding pads or solder bumps or other means for making connection between the device and external circuitry; excising individual devices from a wafer containing multiple devices; other packaging steps; and testing. Another action that may occur at 770 is to tune the resonant frequencies of the resonators within the device by adding or removing metal or dielectric material from the front side of the device. After the filter device is completed, the process ends at 795.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator device comprising:
    a substrate including a plurality of materials and a cavity disposed therein;
    a piezoelectric layer that is attached to the substrate by a dielectric layer;
    an etch-stop layer sandwiched between the substrate and the dielectric layer; and
    an interdigital transducer (IDT) on the piezoelectric layer and having interleaved fingers disposed on a portion of the piezoelectric layer that is over the cavity,
    wherein the etch-stop layer is impervious to an etch process used to form the cavity in the substrate, and
    wherein the dielectric layer is a first dielectric layer and a second dielectric layer is disposed over and between the IDT fingers, wherein a sum of the thickness of the first and second dielectric layers is greater than 35% of a thickness of the piezoelectric layer.

2. The device of claim 1, further comprising a bonding layer between the etch-stop layer and the substrate.

3. The device of claim 2, wherein the substrate is silicon and the bonding layer is silicon dioxide.

4. The device of claim 1, wherein the piezoelectric layer is one of lithium niobate and lithium tantalate.

5. The device of claim 1, wherein the etch-stop layer is one of silicon dioxide, sapphire, a nitride, silicon carbide, and diamond.

6. The device of claim 1, wherein the dielectric layer is silicon dioxide.

7. The device of claim 1, wherein a thickness of the etch-stop layer is less than or equal to 20% of a thickness of the piezoelectric layer.

8. A filter device comprising:
    a plurality of bulk acoustic wave resonators including a shunt resonator and a series resonator, wherein each of the shunt and series resonators comprises:
        a substrate including a plurality of materials and a cavity disposed therein;
        a piezoelectric layer that is attached to the substrate by a dielectric layer;
        an etch-stop layer sandwiched between the substrate and the dielectric layer; and
        a conductor pattern on the piezoelectric layer and including an interdigital transducer (IDT) that includes interleaved fingers disposed on a portion of the respective piezoelectric layer that is over the cavity; and
    wherein an additional dielectric layer is disposed on the piezoelectric layer of the shunt resonator and between the interleaved fingers of the IDT of the shunt resonator,
    wherein the etch-stop layer is impervious to an etch process used to form the respective cavity of each of the shunt and series resonators, and
    wherein a sum of a thickness of the dielectric layer and the additional dielectric layer of the shunt resonator is greater than 35% of a thickness of the piezoelectric layer of the shunt resonators.

9. The filter device of claim 8, further comprising a bonding layer between the etch-stop layer and the substrate of each of the shunt and series resonators.

10. The filter device of claim 9, wherein the substrate is silicon and the bonding layer is silicon dioxide.

11. The filter device of claim 8, wherein the etch-stop layer of each of the shunt and series resonators is one of silicon dioxide, sapphire, a nitride, silicon carbide, and diamond.

12. The filter device of claim 8, wherein the dielectric layer of each of the shunt and series resonators is silicon dioxide.

13. An acoustic resonator device comprising:
- a substrate including a plurality of materials and a cavity disposed therein;
- a piezoelectric layer that is attached to the substrate by a dielectric layer;
- an etch-stop layer sandwiched between the substrate and the dielectric layer; and
- an interdigital transducer (IDT) on the piezoelectric layer and having interleaved fingers disposed on a portion of the piezoelectric layer that is over the cavity,
- wherein the etch-stop layer is impervious to an etch process used to form the cavity in the substrate, and
- wherein a thickness of the etch-stop layer is between 4% and 6% of a thickness of the piezoelectric layer.

* * * * *